United States Patent [19]

Ishigaki

[11] 4,342,006
[45] Jul. 27, 1982

[54] AMPLIFIER CIRCUIT FOR SUPPLYING LOAD WITH OUTPUT SIGNAL CURRENT PROPORTIONAL TO INPUT SIGNAL VOLTAGE

[75] Inventor: Yuzo Ishigaki, Hamamatsu, Japan

[73] Assignee: Nippon Gakki Seizo Kabushiki Kaisha, Hamamatsu, Japan

[21] Appl. No.: 120,767

[22] Filed: Feb. 12, 1980

[30] Foreign Application Priority Data

Feb. 16, 1979 [JP] Japan ............................ 54-18841[U]

[51] Int. Cl.$^3$ ............................................. H03F 3/45
[52] U.S. Cl. .................................. 330/259; 330/253; 330/260; 330/290; 330/293; 360/68
[58] Field of Search ................. 330/97, 102, 259, 260, 330/290, 293, 253; 360/68

[56] References Cited

U.S. PATENT DOCUMENTS

| | | | |
|---|---|---|---|
| 3,260,946 | 7/1966 | Beres et al. ..................... | 330/290 X |
| 3,689,848 | 9/1972 | Geffe et al. ....................... | 330/259 |
| 4,133,010 | 1/1979 | Rossbach ............................. | 360/68 |
| 4,163,264 | 7/1979 | Ishii ..................................... | 360/68 |

OTHER PUBLICATIONS

Hoeffelman et al., "Journal of the Audio Engineering Society," vol. 26, No. 12, Dec. 1978, pp. 935-939.

Primary Examiner—James B. Mullins
Attorney, Agent, or Firm—Frishauf, Holtz, Goodman and Woodward

[57] ABSTRACT

An amplifier circuit comprises a differential or operational amplifier having a first input connected to receive an input signal, and a transistor having its base connected to the output of the differential amplifier, its collector connected to a first power supply terminal through a constant current source and connected to a second input of the differential amplifier through a DC negative feedback circuit, and its emitter connected to a second power supply terminal through a resistor and connected to the first input of the differential amplifier through an AC negative feedback circuit. A load such as a recording head is connected between the collector of the transistor and circuit ground. With this circuit, an output signal current including no DC component and proportional to an input signal voltage flows through the load.

7 Claims, 8 Drawing Figures

AMPLIFIER CIRCUIT FOR SUPPLYING LOAD WITH OUTPUT SIGNAL CURRENT PROPORTIONAL TO INPUT SIGNAL VOLTAGE

BACKGROUND OF THE INVENTION

This invention relates to an amplifier circuit for supplying a load with an output signal current proportional to an input signal voltage, and which is especially suitable for a recording amplifier of a tape recorder.

In FIG. 1 showing a basic circuit arrangement of a prior art amplifier circuit for supplying a load with an output signal current proportional to an input signal voltage, an input terminal 1 connected with a signal source (not shown) is connected to the inverting input of an operational or differential amplifier 2 through a resistor 3 having a resistance value of Ra. The noninverting input of operational amplifier 2 is connected to circuit ground. The output of amplifier 2 is connected to the inverting input of amplifier 2 via a load 4 to provide negative feedback.

In the aforesaid circuit, if an input signal voltage applied to the input terminal 1 is $v_a$, a current $i_a$ flowing through the load 4 is given by $$i_a = -\frac{v_a}{R_a} \qquad (1)$$

Namely, the current $i_a$ flowing through the load 4 is in proportion to the input signal voltage $v_a$ without regard to the impedance of the load 4. In other words, if the input signal voltage $v_a$ is constant, then the load current will be constant independently of the load impedance.

Although functioning as an amplifier, as described above, the circuit of FIG. 1 has such a disadvantage that one terminal of the load 4 cannot be connected to circuit ground because the load 4 is disposed in the feedback circuit of the amplifier 2.

FIG. 2 shows another prior art constant-current amplifier called a constant-current sink type constant-current amplifier, in which an input terminal 5 is connected to the noninverting input of an operational amplifier 6, whose output is connected to the base of a transistor 7. The emitter of transistor 7 is connected to the inverting input of amplifier 6 and also connected to a negative power supply terminal 9 through a resistor 8 with a resistance value of Rb, while the collector of transistor 7 is connected to a positive power supply terminal 10 through a load 11.

In such a circuit, the negative power terminal 9 may be regarded as circuit ground with respect to AC signals. Accordingly, if a base current of transistor 7 is ignored, a current $i_b$ flowing through the load 11 when a signal voltage $v_b$ is applied to the input terminal 5 will be given by $$i_b = \frac{v_b}{R_b} \qquad (2)$$

Like the circuit of FIG. 1, the circuit of FIG. 2 functions as an amplifier. With such a drawback that the load current has a DC component because the direction of the instantaneous current flowing through the load 11 is always fixed, however, this circuit is not fit for use as a recording amplifier to supply a signal current to a recording head.

SUMMARY OF THE INVENTION

An object of this invention is to provide an amplifier circuit for supplying a load with a signal current including no DC component and substantially in porportion to an input signal voltage.

An amplifier circuit of this invention comprises a differential or operational amplifier with first and second inputs and an output transistor, the first input of the amplifier being one of inverting and noninverting inputs which is connected to receive an input signal, and the second input being the other. The output transistor has its base connected to the output of the differential amplifier, its collector connected to a first power supply terminal through a constant-current source and also connected to the second input of the differential amplifier through a DC negative feedback circuit, and its emitter connected to a second power supply terminal through a resistor and also connected to the first input of the differential amplifier through an AC negative feedback circuit. A load such as a recording head is connected between the collector of the output transistor and circuit ground.

According to this invention, the output transistor is controlled such that a DC potential of its collector becomes zero. As a result, the load may be connected directly with the collector of the output transistor without utilizing any coupling capacitor, and an output signal current including no DC component and substantially proportional to an input signal voltage is allowed to flow through the load.

DETAILED DESCRIPTION OF THE PREFERRED EMBODIMENTS

Figure 1:
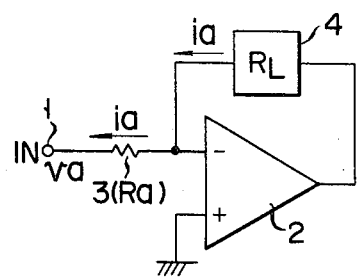
FIGS. 1 and 2 show configurations of prior art amplifier circuits for supplying a load with an output signal current proportional to an input signal voltage.
Figure 2:
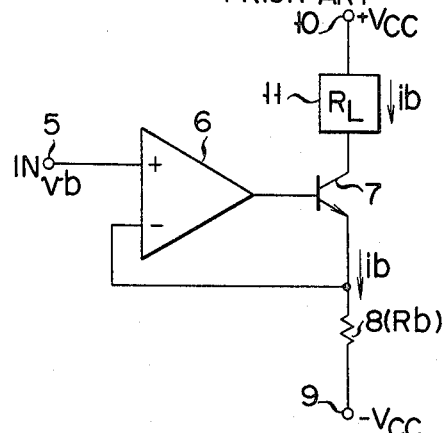
Figure 3:
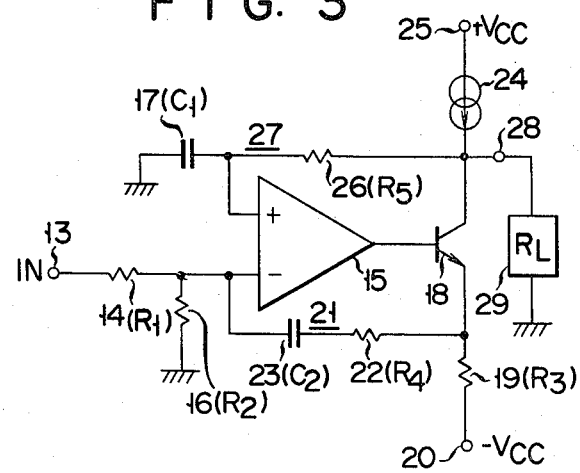
FIG. 3 schematically shows an amplifier circuit according to an embodiment of this invention.

Referring now to FIG. 3 showing an amplifier circuit according to a first embodiment of this invention, an input terminal 13 connected with an input signal source is connected through a resistor 14 having a resistance value of R1 to the inverting input of an amplifier 15 which is connected to circuit ground via a resistor 16 with a resistance value of R2. The noninverting input of amplifier 15 is connected to circuit ground through a capacitor 17 with a capacitance value of C1. The output of amplifier 15 is connected to the base of an NPN-type transistor 18 having its emitter connected to a negative power supply terminal 20 ($-V_{CC}$) through a resistor 19 with a resistance value of R3, and its collector connected to a positive power supply terminal 25 ($+V_{CC}$) through a constant-current source 24. An AC negative feedback circuit 21 including a resistor 22 with a resistance value of R4 and a capacitor 23 with a capacitance value of C2 which are connected in series with each other is connected between the emitter of transistor 18 and the inverting input of the amplifier 15, while a resistor 26 with a resistance value of R5 is connected between the collector of transistor 18 and the noninverting input of the amplifier 15. The capacitor 17 and the resistor 26 constitute a DC negative feedback circuit 27. The collector of transistor 18 is connected to an output terminal 28. Between the output terminal 28 and circuit ground, there is connected a load 29 such as a recording head. The respective capacitance values C1 and C2 of the capacitors 17 and 23 are selected so that they have a sufficiently low impedance with respect to the lowest signal frequency to be amplified.

Figure 4:
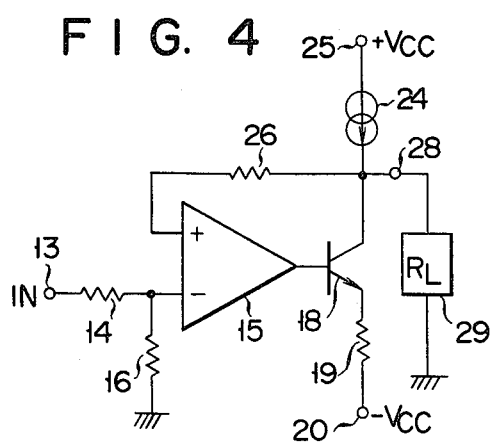
FIGS. 4 and 5 show DC and AC equivalent circuits of the circuit of FIG. 3, respectively.
Figure 5:
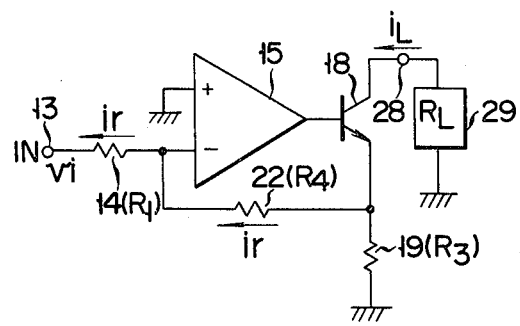

Referring now to FIGS. 4 and 5, there will be described the operation of the above-mentioned circuit. Since the capacitors 17 and 23 have infinite impedance with respect to DC component, the DC equivalent circuit of the circuit of FIG. 3 may be written as shown in FIG. 4. In this equivalent circuit, the inverting input of amplifier 15 is grounded by means of the resistor 16, so that the potential at the input is zero. Since the noninverting input of amplifier 15 is provided by the resistor 26 with DC negative feedback from the collector of transistor 18 whose base is connected to the output of amplifier 15, the potentials at the noninverting input of amplifier 15 and the collector of transistor 18 are both regarded as zero. Therefore, even if the load 29 is directly connected with the collector of transistor 18 as illustrated, no DC current will be allowed to flow through the load 29.

With respect to AC signal to be amplified, the impedances of capacitors 17 and 23 can be regarded as zero since these capacitors are so selected, while the impedance of the constant-current source 24 may be considered to be infinitely great. Accordingly, the AC equivalent circuit with respect to AC signals to be amplified by the circuit of FIG. 3 may be written as shown in FIG. 5. Since the potential at the inverting input of the amplifier 15 is zero, an input signal voltage $v_i$ applied to the input terminal 13, and a current $i_r$ flowing through the resistor 22 may be expressed as follows:

$$I_r = \frac{v_i}{R1} \quad (3)$$

If a base current of transistor 18 is ignored, a voltage drop across the resistor 19 will be given by R3 ($i_L-i_r$), which is equal to a voltage drop R4·$i_r$ across the resistor 22. Thus, $$R3 \, (i_L-i_r) = R4 \cdot i_r \quad (4)$$

where $i_L$ is an output signal current flowing through the load 29. Eliminating $i_r$ from equations (4) and (3) yields $$i_L = \frac{v_i}{R1} \cdot \frac{R3 + R4}{R3} \quad (5)$$

Namely, it may be understood that, in the circuit of FIG. 3, the signal current $i_L$ proportional to the input signal voltage $v_i$ flows through the load 29. The upper limit of dynamic range of the circuit of FIG. 3, i.e. the peak-to-peak value of the maximum output signal current, may be given by substantially $2V_{CC}/RL$, securing a fully wide dynamic range.

Figure 6:
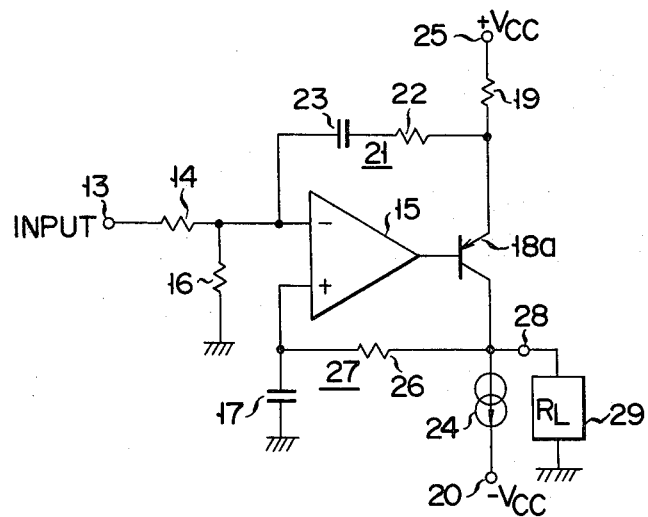
FIG. 6 schematically shows an amplifier circuit according to another embodiment of the invention.

FIG. 6 shows a circuit diagram according to a second embodiment of this invention, in which a PNP-type transistor 18a is substituted for the transistor 18 of FIG. 3. Since the conductivity type of the output transistor is inverted, the resistor 19 is connected between the emitter of transistor 18a and the positive power supply terminal 25, and the constant-current source 24 is connected between the collector of transistor 18a and the negative power supply terminal 20. In FIG. 6, the same parts as those shown in FIG. 3 are designated by like reference numerals, and are excluded from further description. Although the load current in the circuit of FIG. 6 is opposite in phase to that of FIG. 3, the circuit of FIG. 6 operates in the same manner as the circuit of FIG. 3.

Figure 7:
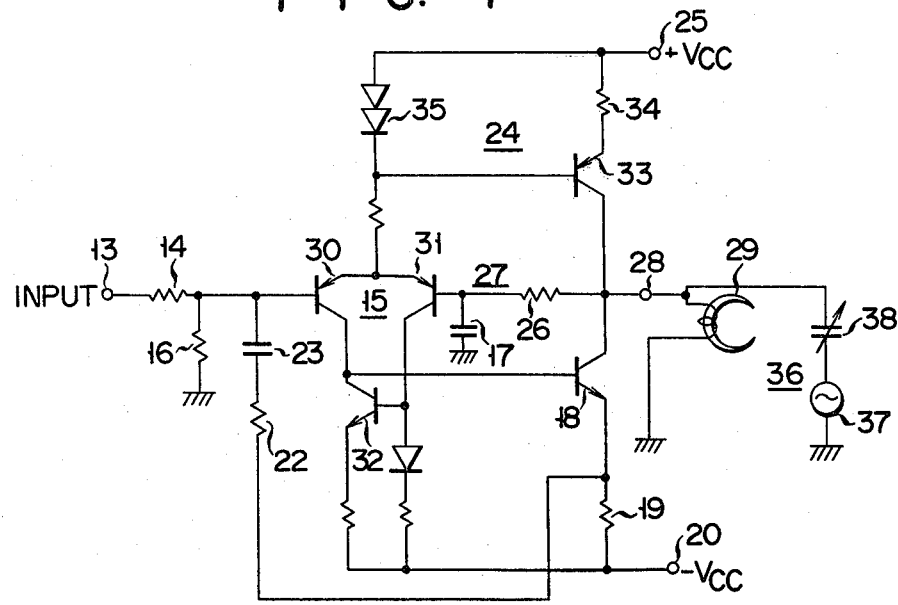
FIG. 7 schematically shows a practical circuit arrangement of the embodiment of FIG. 3.

FIG. 7 shows a practical circuit arrangement of the embodiment of FIG. 3, in which the amplifier 15 is composed of a differential pair of transistors 30 and 31 and a constant-current transistor 32, and a constant current source 24 is composed of a transistor 33, a resistor 34 and diodes 35. This circuit is suitably used as a recording amplifier for supplying a signal current to a recording head, and thus a recording head is used as the load 29. Being an amplifier circuit with a considerably high output impedance, the amplifier circuit of the invention requires no bias signal blocking trap when used as a recording amplifier. Thus, a bias signal supplying circuit 36 comprised of a bias signal oscillator 37 and a variable capacitor 38 for bias signal adjustment may be connected directly to the output terminal 28 as illustrated.

Figure 8:
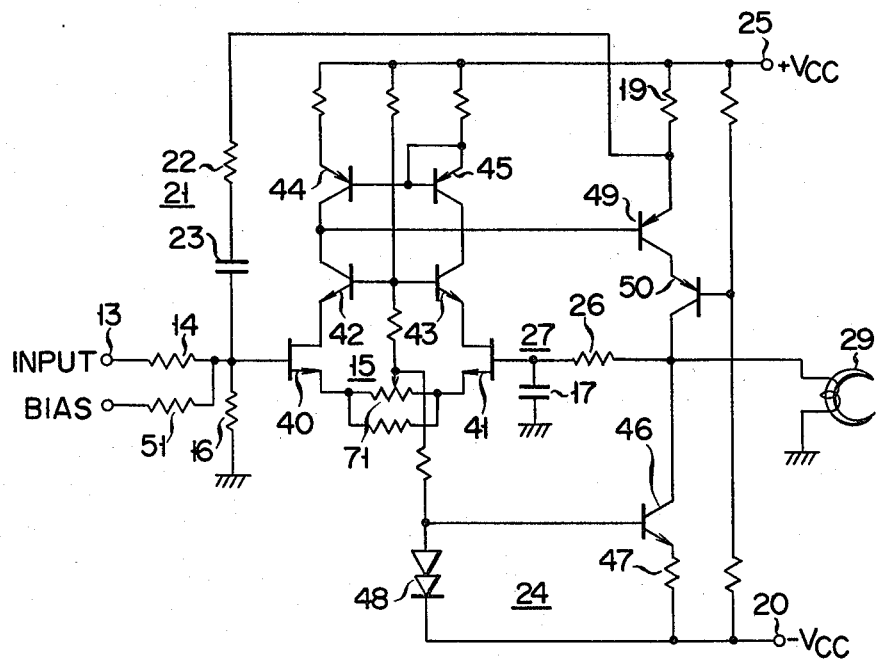
FIG. 8 schematically shows a practical circuit arrangement of the embodiment of FIG. 6.

FIG. 8 shows a practical circuit arrangement of the embodiment of FIG. 6, in which the amplifier 15 is composed of a differential pair of field-effect transistors 40 and 41 and bipolar transistors 42 to 45. The transistors 42 and 43 are provided for the purpose of stabilizing input impedance, as disclosed in U.S. Pat. Appln. Ser. No. 12,701 entitled "DIFFERENTIAL AMPLIFIER CIRCUIT ARRANGEMENT WITH STABILIZED INPUT IMPEDANCE", filed on Feb. 16, 1979, and now U.S. Pat. No. 4,276,515 and assigned to the same assignee as this invention. The constant-current source 24 is comprised of a transistor 46, a resistor 47, and diodes 48. In this circuit, the transistor 18a of FIG. 6 is replaced by a cascade connection including a common-emitter transistor 49 and a common-base transistor 50 connected in series with each other. Like the circuit of FIG. 7, this circuit is suitably used as a recording amplifier, and thus a recording head is used as the load 29. Also in this circuit, like the one shown in FIG. 7, the bias signal supplying circuit 36 may be connected directly with the head 29. Alternatively, as illustrated, a bias signal may be supplied through a resistor 51 to the inverting input of the amplifier 15 to which the input signal is applied, that is, to the gate of transistor 40. The input signal and bias signal can be summed linearly by supplying them to the inverting input of the amplifier 15. Namely, according to this invention, a recording amplifier with reduced cross modulation distortion is provided by superposing the input signal and bias signal at the inverting input of an operational or differential amplifier. It is to be understood that the input and bias signals may be superposed at the inverting input of the operational or differential amplifier also in the circuit of FIG. 7.

What is claimed is:
1. An amplifier circuit comprising:
an output terminal;
first and second power supply terminals;

an amplifier having first and second inputs and an output, said first input being connected to receive an input signal and being one of inverting and noninverting inputs and said second input being the other of inverting and noninverting inputs;

a transistor having a base, an emitter and a collector, said base of said transistor being coupled to said output of said amplifier, and said collector of said transistor being connected to said output terminal of said amplifier circuit;

a constant-current source connected between said collector of said transistor and said first power supply terminal;

a resistor connected between said emitter of said transistor and said second power supply terminal;

an AC negative feedback circuit connected between said emitter of said transistor and said first input of said amplifier; and a DC negative feedback circuit connected between said collector of said transistor and said second input of said amplifier.

2. The amplifier circuit according to claim 1, wherein said first and second inputs of said amplifier are inverting and noninverting inputs, respectively.

3. The amplifier circuit according to claim 1, wherein a load is connected between said output terminal of said amplifier circuit and circuit ground.

4. The amplifier circuit according to claim 3, wherein said load is a recording head.

5. The amplifier circuit according to claim 1, further comprising a recording head connected between said output terminal of said amplifier circuit and circuit ground; and a bias signal supply circuit connected between said output terminal of said amplifier circuit and circuit ground.

6. The amplifier circuit according to claim 5, wherein said bias signal supply circuit includes an oscillator and a variable capacitor connected in series with said oscillator.

7. The amplifier circuit according to claim 1, further comprising a recording head connected between said output terminal of said amplifier circuit and circuit ground; and means for applying a bias signal to said first input of said amplifier.

* * * * *